United States Patent
Matei et al.

(10) Patent No.: US 11,489,533 B2
(45) Date of Patent: Nov. 1, 2022

(54) TECHNIQUE FOR SMOOTHING FREQUENCY TRANSITIONS DURING CLOCK DITHERING

(71) Applicant: Apple Inc., Cupertino, CA (US)

(72) Inventors: Bogdan-Eugen Matei, Munich (DE); Hartmut Sturm, Germering (DE)

(73) Assignee: Apple Inc., Cupertino, CA (US)

( * ) Notice: Subject to any disclaimer, the term of this patent is extended or adjusted under 35 U.S.C. 154(b) by 21 days.

(21) Appl. No.: 16/861,103

(22) Filed: Apr. 28, 2020

(65) Prior Publication Data

US 2021/0336626 A1 Oct. 28, 2021

(51) Int. Cl.
*H03L 7/197* (2006.01)
*H02M 1/14* (2006.01)
*H02M 1/44* (2007.01)

(52) U.S. Cl.
CPC .......... *H03L 7/1974* (2013.01); *H02M 1/143* (2013.01); *H02M 1/44* (2013.01)

(58) Field of Classification Search
CPC ........ H02M 1/44; H02M 1/143; H03L 7/1974
USPC ....................................................... 327/156
See application file for complete search history.

(56) References Cited

U.S. PATENT DOCUMENTS

| | | | |
|---|---|---|---|
| 8,890,596 B2 | 11/2014 | Chen | |
| 9,036,377 B2 | 5/2015 | Chang et al. | |
| 9,641,085 B2 | 5/2017 | Li | |
| 2008/0157894 A1* | 7/2008 | Hariton | H03K 7/10 |
| | | | 332/109 |
| 2018/0142800 A1* | 5/2018 | Kato | F16K 31/0675 |

\* cited by examiner

*Primary Examiner* — Metasebia T Retebo
(74) *Attorney, Agent, or Firm* — Kowert, Hood, Munyon, Rankin & Goetzel, P.C.; Scott W. Pape; Dean M. Munyon (57) ABSTRACT

An apparatus includes a power converter circuit configured to generate a voltage level on a regulated power supply node using a clock signal, and a clock generation circuit configured to dither a frequency of the clock signal. To transition from a first frequency to a second frequency, the clock generation circuit is configured to change, during an initial transition period, the clock signal between the first and second frequencies such that a particular percentage of clock pulses have the second frequency. During one or more intermediate transition periods, the clock generation circuit is configured to change the clock signal between the first and second frequencies such that a percentage of clock pulses having the second frequency increases relative to a prior transition period. During a final transition period of the series, the clock generation circuit is configured to set the frequency of the clock signal to the second frequency.

20 Claims, 8 Drawing Sheets

( Start 501 )

Generating, by a power converter circuit, a particular voltage level on a regulated power supply node using a clock signal.
510

Dithering, by a clock generation circuit, the clock signal across a range of frequencies, including transitioning from a first frequency in the range to a second frequency in the range.
520

Wherein the transitioning includes:

In response to an indication to change a frequency of the clock signal from the first frequency of the range to the second frequency of the range, changing, during a first transition period of a series of transition periods, the clock signal between the first frequency and a second frequency, wherein the clock signal is at the second frequency for a first amount of time.
530

In response to an end of the first transition period, changing, during one or more intermediate transition periods of the series, the clock signal between the first and second frequencies, wherein an amount of time the clock signal is at the second frequency increases for each intermediate transition period compared to a prior transition period.
540

Setting, during a final transition period of the series, the frequency of the clock signal to the second frequency.
550

( End 590 )

TECHNIQUE FOR SMOOTHING FREQUENCY TRANSITIONS DURING CLOCK DITHERING

BACKGROUND

Technical Field

Embodiments described herein are related to the field of integrated circuits, and more particularly to clock generation circuits that implement dithering techniques.

Description of the Related Art

A computer system or integrated circuit (IC), such as a system-on-a-chip (SoC), may include one or more clock generation circuits that create clock signals for use my a variety of circuits. While some circuits may benefit from a clock signal with a stable frequency, other circuits may be susceptible to energy caused by a clock signal with a stable frequency. For example, power conversion circuits may generate electromagnetic interference (EMI) on power supply signals due to switching frequencies of charging/discharging sub-circuits (referred to herein as "switching circuits"). When the switching circuits activate, a large current may be sourced or sunk on the regulated supply node, which in turn may cause EMI to be emitted from the regulated power supply node. One mitigation technique used with power conversion circuits and other susceptible circuits is dithering a frequency of a clock signal used by these circuits. Dithering a clock signal may spread EMI energy across a range of frequencies rather than focusing harmonic energy into a very narrow band of frequencies, thereby reducing a peak amount of EMI energy at any one particular frequency.

Dithering a frequency of a clock signal, however, may create other issues for circuits using the clock signal. In the power conversion circuit example, dithering a clock signal used by the charging/discharging sub-circuits may increase a peak-to-peak voltage ripple on the generated power signal. Such voltage ripple may cause reduced performance or glitches in circuits that are powered by the power supply signal.

SUMMARY OF THE EMBODIMENTS

Broadly speaking, apparatus, and methods are contemplated in which an apparatus includes a power converter circuit configured to generate a particular voltage level on a regulated power supply node using a clock signal, and a clock generation circuit configured to dither a frequency of the clock signal among a range of frequencies, including transitioning from a first frequency in the range to a second frequency in the range. To transition from the first frequency to the second frequency, the clock generation circuit is configured to change, during an initial transition period of a series of transition periods, the frequency of the clock signal between the first and second frequencies such that a particular percentage of clock pulses have the second frequency. During one or more intermediate transition periods of the series, the clock generation circuit is configured to change the frequency of the clock signal between the first and second frequencies such that a percentage of clock pulses having the second frequency increases relative to a prior transition period. During a final transition period of the series, the clock generation circuit is configured to set the frequency of the clock signal to the second frequency. The final transition period does not include clock pulses at the first frequency.

In a further example, during the initial and intermediate transition periods, the clock generation circuit is configured to toggle the frequency of the clock signal between the first and second frequencies a plurality of times. The frequency of the clock signal remains set for a plurality of clock cycles between each toggle. In one example, the first frequency is greater than the second frequency.

In another example, to dither the frequency of the clock signal among the range of frequencies the clock generation circuit is configured to transition the frequency of the clock signal from the second frequency to a third frequency in the range. The third frequency is different from the first frequency. To transition from the second frequency to the third frequency, the clock generation circuit is configured to change, during an initial transition period of a different series of transition periods, the frequency of the clock signal between the second and third frequencies such that the particular percentage of clock pulses have the third frequency. During one or more intermediate transition periods of the different series, the clock generation circuit is configured to change the frequency of the clock signal between the second and third frequencies. A percentage of clock pulses having the third frequency increases for each of the intermediate transition periods relative to a prior transition period.

In an embodiment, the clock generation circuit is further configured to transition from the second frequency to the third frequency in response to a determination that a dithering interval has elapsed since transitioning from the first frequency to the second frequency. The dithering interval is greater than a total amount of time for the series of transitioning periods. In one example, the clock generation circuit is further configured to determine the second frequency by subtracting a predetermined frequency step from the first frequency.

In a further example, the clock generation circuit is further configured to generate twenty-five percent of the clock pulses at the second frequency during the initial transition period, and to generate fifty percent of the clock pulses at the second frequency during a first intermediate transition period. The clock generation circuit is also configured to generate seventy-five percent of the clock pulses at the second frequency during a second intermediate transition period, and to generate one hundred percent of the clock pulses at the second frequency during the final transition period.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Dithering techniques are commonly used on clock signals for which EMI may pose performance and/or functionality issues. For example, clock dithering may be used on a power conversion circuit, such as a buck regulator or a switching regulator, to reduce a peak amount of EMI at any one given frequency on a power supply signal generated by the power conversion circuit. Dithering techniques include switching the frequency of a clock signal across a range of frequencies that are centered around a base frequency, such that a long-term average frequency of the clock signal is at or near the base frequency. Each frequency change may be referred to as a step. Dithering a clock signal used by the power conversion circuit may, however, result in an increase in peak-to-peak voltage ripple on the power supply signal. The increase in the voltage ripple may be caused by abrupt changes in the frequency of the clock signal as a dithering operation changes the clock signal frequency by a particular frequency step. Reducing the frequency step size may reduce the voltage ripple, but also reduce the frequency range of the dithering, or require more frequency steps to maintain a same range. Reducing the dithering frequency range concentrates the EMI energy into a narrower band of frequencies, thereby reducing a benefit of the dithering operation. Increasing a number of frequency steps increases a complexity of the clock generation circuit, thereby increasing a die size and/or cost of the clock generation circuit. The inventors have recognized an advantage to developing a technique for transitioning the frequency of a clock signal at a dithering step that reduces an abruptness of the frequency transition without requiring a reduction in the frequency step size.

Embodiments of apparatus and methods are presented for smoothing transitions of a clock signal that is being dithered. One such embodiment includes, in response to a transition from a first frequency to a second frequency that is part of a dithering technique for a clock signal, changing, by a clock generation circuit, between the first and second frequencies over a series of transition periods. In multiple transition periods, the clock signal is changed between the first and second frequencies such that a percentage of clock pulses having the second frequency increases relative to a prior transition period. In a final transition period of the series, the frequency of the clock signal is set to the second frequency and remains until a next frequency transition occurs as part of the dithering technique. Use of the described transition periods may result in a more gradual fade from the first frequency to the second frequency without using an intermediate frequency between the first and second frequencies. Smoothing the frequency transition without use of intermediate frequencies may allow larger frequency step sizes, thereby reducing a design complexity of the clock generation circuit.

Figure 1:
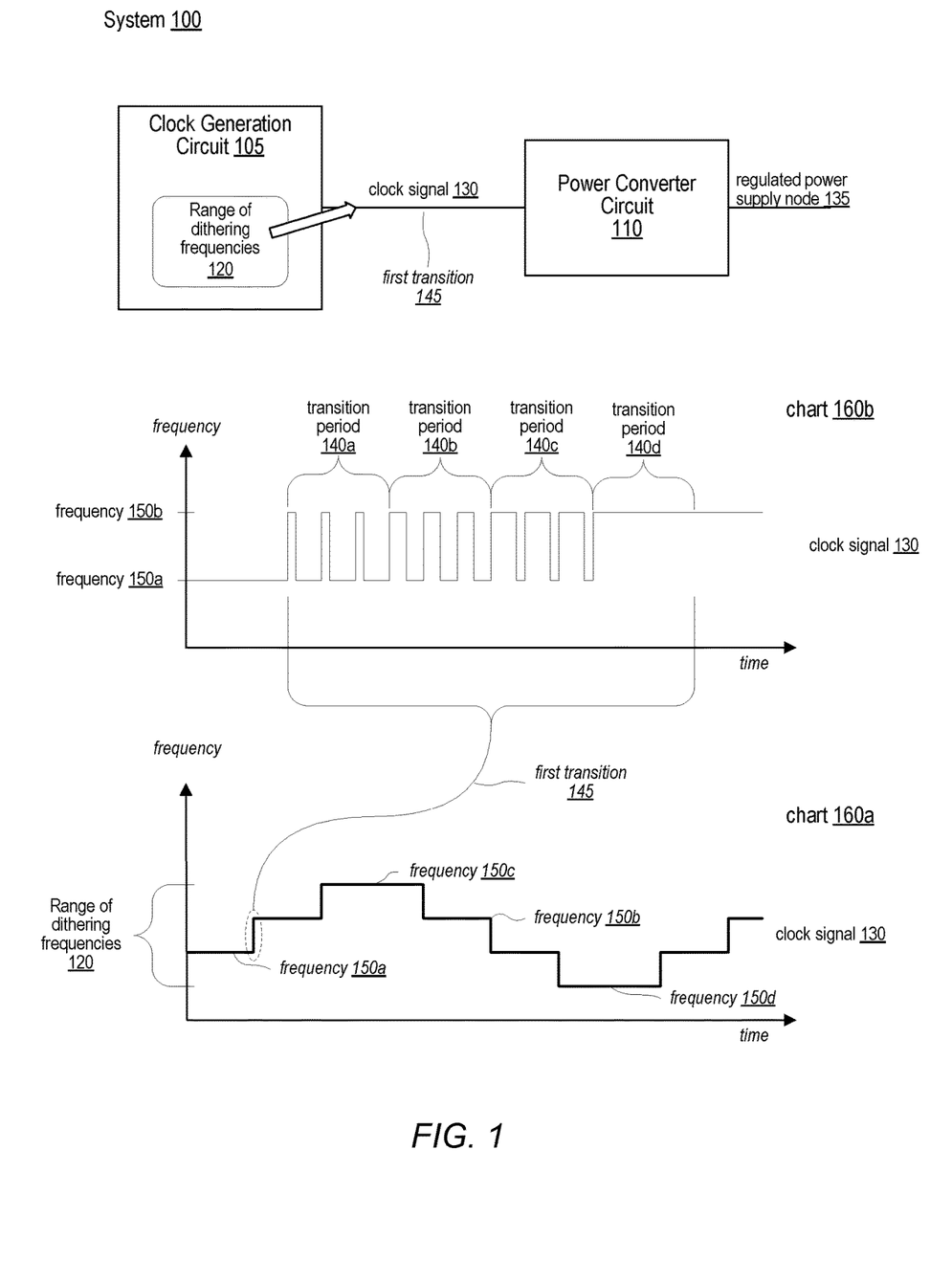
FIG. 1 illustrates a block diagram of an embodiment of a system that includes a clock generation circuit and a power conversion circuit, as well as two charts depicting signals associated with a clock signal.

A block diagram for an embodiment of a system is illustrated in FIG. 1. System 100 may be included in a computing device as part of a power management unit that, for example, provides one or more power supply signals to one or more integrated circuits (ICs). As illustrated, system 100 includes clock generation circuit 105 and power converter circuit 110. Clock generation circuit 105 is configured to generates clock signal 130 which is received by power converter circuit 110 and utilized to generate a power supply signal on regulated power supply node 135. Two charts are shown, charts 160a and 160b, that depict how a frequency of clock signal 130 changes over time.

Power converter circuit 110 is configured to generate a particular voltage level on regulated power supply node 135 using clock signal 130. In various embodiments, power converter circuit 110 corresponds to any suitable type of power converter design that utilizes a clock signal to generate a power signal, such as a buck regulator or switching regulator. In order to reduce switching-related EMI at a particular switching frequency, clock generation circuit 105 is configured to dither a frequency of clock signal 130 by stepping the frequency across a range of dithering frequencies 120. A size of each step, e.g., a difference between a current frequency and a next frequency, may depend on an application of circuits that utilize the clock signal. In regards to power conversion, a frequency step size may be, for example, increments and decrements on the order of 5% of the base frequency, although other step sizes may be used. The range of frequencies is determined based on a number of steps taken above and below the base frequency. For example, clock signal 130 may be dithered by +/−3 steps from the base frequency. Accordingly, if the base frequency is, for example, 1.0 megahertz (MHz) and the step size is 50 kilohertz (kHz), then the range of frequencies is from 850 kHz to 1.15 MHz for +/−3 steps.

To perform first transition 145 from a first frequency (frequency 150a) to a second frequency (frequency 150b), clock generation circuit 105 is configured to change the frequency of clock signal 130 between frequencies 150a and 150b over a series of transition periods 140a-140d (transition periods 140 for short). As illustrated in chart 160a, clock generation circuit 105 dithers the frequency of clock signal 130 across range of dithering frequencies 120, with the frequency of clock signal 130 remaining at a particular frequency for a particular amount of time. Chart 160b shows details of how clock generation circuit 105 performs first transition 145 from frequency 150a to frequency 150b as one step of the dithering process.

As shown in chart 160b, clock generation circuit 105 is configured to change, during transition period 140a, the frequency of clock signal 130 between the lower frequency 150a and the higher frequency 150b such that a particular percentage of clock pulses have frequency 150b. Although frequency 150a is shown as being less than frequency 150b, in other embodiments, the reverse is true. As shown in chart 160b, clock signal 130 is set to frequency 150b for three short amounts of time, and is returned to frequency 150a for three longer amounts of time. The total amount of time that the frequency remains at a given frequency during transition periods 140 may vary in different embodiments. Each transition within transition period 140a last for one or more cycles of clock signal 130. The particular percentage of cycles of clock signal 130 that have frequency 150b for all of transition period 140a is less than 50%, for example 25%.

During one or more intermediate transition periods of the series (e.g., transition periods 140b and 140c), clock generation circuit 105 is configured to change the frequency of clock signal 130 between frequencies 150a and 150b such that a percentage of clock pulses having the frequency 150b increases relative to a prior transition period. For example, in transition period 140b, 50% of the cycles of clock signal 130 may have frequency 150b and the remaining 50% of the cycles have frequency 150a. In transition period 140c, the percentages may change such that 75% of the cycles of clock signal 130 have frequency 150b and the remaining 25% of the cycles have frequency 150a.

During a final transition period of the series (e.g., transition period 140d), clock generation circuit 105 is configured to set the frequency of clock signal 130 to frequency 150b, wherein transition period 140d does not include clock pulses at frequency 150a. In this final transition period 140d, the frequency of clock signal 130 is fully transitioned to frequency 150b and remains at this frequency until a next frequency step of the dithering process occurs, for example, from frequency 150b to frequency 150c.

It is noted that the described process may provide a more gradual change in frequency of clock signal 130, creating an effect of a frequency ramp from frequency 150a to 150b, as opposed to an abrupt change in which clock signal 130 is simply changed frequency 150a to 150b with no transition periods. For example, using percentages of 25%, 50%, and 75%, and assuming frequency 150a is 1.00 MHz and frequency 150b is 1.05 MHz, use of the transition periods 140 may generate a similar effect as changing clock signal 130 to 1.0125 MHz in transition period 140a, 1.025 MHz in transition period 140b, 1.0375 MHz in transition period 140c, and ending with 1.05 MHz in transition period 140d. Clock generation circuit 105, however, is not required to be capable of generating frequencies other than 1.00 MHz and 1.05 MHz in this case. Instead, clock generation circuit 105 may be designed to support step sizes of 50 kHz rather than the 12.5 kHz steps realized from the transition technique.

It is further noted that the system of FIG. 1 is merely an example. The illustration of FIG. 1 has been simplified to highlight features relevant to this disclosure. Various embodiments may include different configurations of the circuit blocks. For example, in other embodiments, power converter circuit 110 may be replaced by a different functional circuit, such as a synchronous communication interface in order to reduce peak EMI on a cable coupled to the communication interface.

The clock generation circuit illustrated in FIG. 1 is described as using a transitioning technique to adjust the frequency of the clock signal as part of a frequency dithering process. Frequency dithering of a clock signal may be implemented in a variety of ways. Charts in FIG. 2 provide additional details regarding dithering techniques that may be used with the disclosed concepts.

Figure 2:
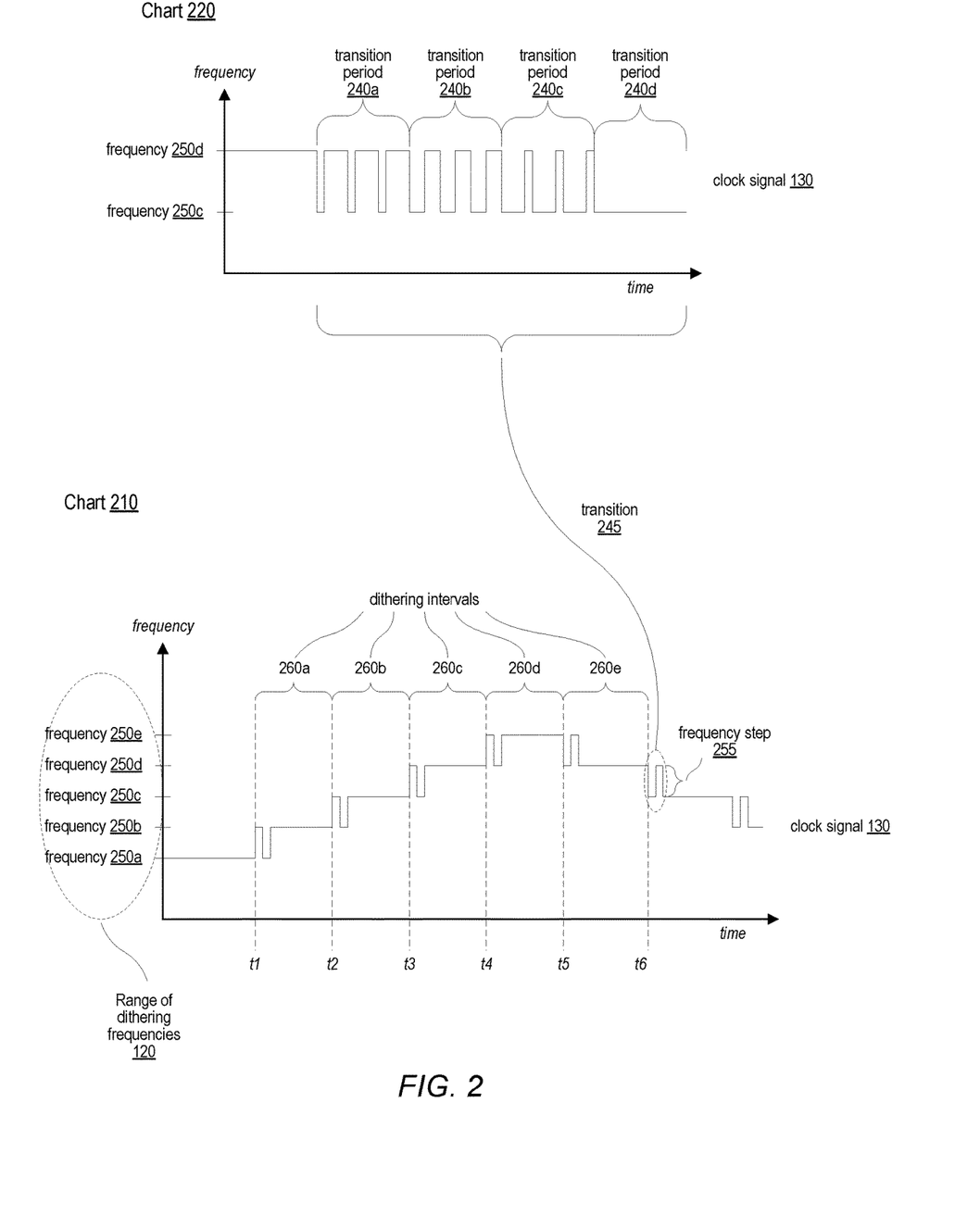
FIG. 2 shows two charts depicting signals associated with frequency transitions of a clock signal.

Moving to FIG. 2, two charts, each depicting a respective waveform associated with an embodiment of a clock generation circuit, such as clock generation circuit 105 in FIG. 1, is illustrated. Chart 210 depicts frequency versus time for clock signal 130, as clock signal 130 is dithered across range of dithering frequencies 120 including frequencies 250a-250e (collectively frequencies 250). Chart 220 depicts a series of transition periods 240a-240d that are utilized to perform one transition of the dithering process.

In regards to chart 210, clock generation circuit 105 dithers the frequency of clock signal 130 between frequencies 250a and 250e using a plurality of transitions, such as a transition 245. Each transition is one step higher or lower than a current frequency of clock signal 130. Clock generation circuit 105, therefore, is configured to determine a second frequency (e.g. frequency 250d at time t5) by adding or subtracting a predetermined frequency step 255 to a first frequency (e.g., frequency 250e). Frequency step 255 may be determined, for example, based on a frequency resolution of clock generation circuit 105. Clock generation circuit 105 may have a minimum frequency step that it is capable of producing. To design clock generation circuit 105 to produce a smaller frequency step 255 may increase a die area and/or power consumption of clock generation circuit 105.

Clock generation circuit 105 is also configured to transition from the second frequency 250d to a third frequency 250c in response to a determination that a dithering interval 260e has elapsed since transitioning from frequency 250e to frequency 250d. Dithering intervals 260a-260e are greater than a total amount of time for the series of transitioning periods 240a-240d. The durations of dithering intervals 260a-260e may be selected to be short enough to suitably spread EMI emissions across the range of dithering frequencies, but long enough to produce an acceptable power signal on regulated power supply node 135. Additional details regarding the duration of dithering intervals 260a-260e and their effect on regulated power supply node 135 are provided below, in regard to FIG. 3.

For each dithering transition, such as transition 245, clock generation circuit 105, as disclosed above, transitions from an old frequency to a new frequency over a series of transition periods 240a-240d. In chart 210, each transition is shown with a single toggle back to the old frequency. Chart 220, however, illustrates transition 245 in more detail to demonstrate how the transition periods 240a-240d are implemented.

As shown, chart 220 depicts transition 245 from frequency 250e to frequency 250d (e.g., a step down in frequency). As disclosed, dithering the frequency of clock signal 130 among the range of dithering frequencies 120 includes transitioning (at time t5) from frequency 250e to frequency 250d, and transitioning (at time t6) from frequency 250d to frequency 250c, that is different from frequency 250e. To transition from frequency 250d to frequency 250c, clock generation circuit 105 is configured to make the transition using a series of transition periods 240a-240d. During an initial transition period (240a) of the series, clock generation circuit 105 changes the frequency of clock signal 130 between frequencies 250d and 250c such that the particular percentage of clock pulses have frequency 250c. During one or more intermediate transition periods (240b and 240c) of the series, clock generation circuit 105 changes the frequency of clock signal 130 between frequencies 250d and 250c such that a percentage of clock pulses having frequency 250c increases for each intermediate transition period relative to a prior transition period.

For example, clock generation circuit 105 may be configured to generate twenty-five percent of the clock pulses of clock signal 130 at frequency 250c during transition period 240a, generate fifty percent of the clock pulses at frequency 250c during transition period 240b, generate seventy-five percent of the clock pulses at frequency 250c during transition period 240c, and generate one hundred percent of the clock pulses at frequency 250c during the final transition period 240d. As previously disclosed, these increasing percentages may reduce an abruptness of the frequency transition, thereby creating an effect of a frequency ramp from frequency 250d to 250c. Such a frequency ramp may reduce voltage ripple generated by power converter circuit 110 on regulated power supply node 135.

To change, during transition periods 240a-240c, the frequency of clock signal 130 between frequencies 250d and 250c, clock generation circuit 105 is configured to toggle the frequency of clock signal 130 between frequencies 250d and 250c a plurality of times. The frequency of clock signal 130 remains set for a plurality of clock cycles between each toggle. For example, during transition period 240a, clock generation circuit 105 may generate two cycles of clock signal 130 at frequency 250c followed by six cycles at frequency 250d, thereby generating twenty-five percent of the cycles at frequency 250c and seventy-five percent at frequency 250d. As illustrated, the frequency is toggled three times between frequency 250d and 250c. By toggling the frequency multiple times in transition period 240a, an average frequency that is twenty-five percent lower than frequency 250d (and seventy-five percent higher than frequency 250c) may be more accurately emulated, in comparison to transitioning to frequency 250c for six continuous cycles and then back to frequency 250d for eighteen consecutive cycles. A similar procedure may be utilized for transition periods 240b and 240c. Since transition period 240d includes one hundred percent of the clock cycles at frequency 250c, no toggling is performed.

Clock generation circuit 105 is configured to determine a duration for each of the series of transition periods 240a-240d using a particular number of cycles of clock signal 130. Continuing the example just described, transition period 240a includes three toggles of the frequency of clock signal 130 between frequency 250d and 250c in which two clock cycles are generated at frequency 250c for every six clock cycles generated at frequency 250d. For the three toggles, twenty-four total clock cycles are generated. To generate fifty percent of clock cycles at each frequency, four clock cycles are generated at each frequency during each toggle in transition period 240b. For transition period 240c, the cycle counts are reversed from transition period 240a, such that six clock cycles are generated at frequency 250c for every two clock cycles generated at frequency 250d.

In various embodiments, different percentages may be utilized by adjusting a number of clock cycles generated at either, or both, frequencies of the transition. Although the example illustrates use of three toggles of eight cycles per toggle for each transition period, any suitable number of toggles and cycles per toggle may be utilized to produce desired transition characteristics. It is noted, that as used herein in relation to a change in clock frequency from a first to a second frequency, a "frequency toggle," or simply a "toggle," refers to a single generation of a number of consecutive clock cycles at the second frequency followed by a single generation of a number of consecutive clock cycles generated at the first frequency.

Transition period 240d does not include any toggling of the frequency of clock signal 130. Instead, transition period 240d is shown with one hundred percent of clock cycles generated at frequency 250c. In some embodiments, transition period 240d may be utilized as a settling time during which other changes to clock signal 130 are restricted, allowing clock signal 130 to settle at the new frequency. In other embodiments, transition period 240d may be omitted and the transition to the new frequency is considered complete at the end of transition period 240c with the final transition to frequency 250c.

It is also noted that the waveforms shown in FIG. 2 are merely examples to demonstrate the disclosed concepts. In other embodiments, the frequency domain waveforms may appear different due to circuit designs used to implement clock generation circuit 105, manufacturing limitations creating less than ideal circuit elements, and the like. Additionally, although four transition periods are shown, any suitable number of transition periods may be included, with ratios between frequencies set at any desired percentages.

Figure 3:
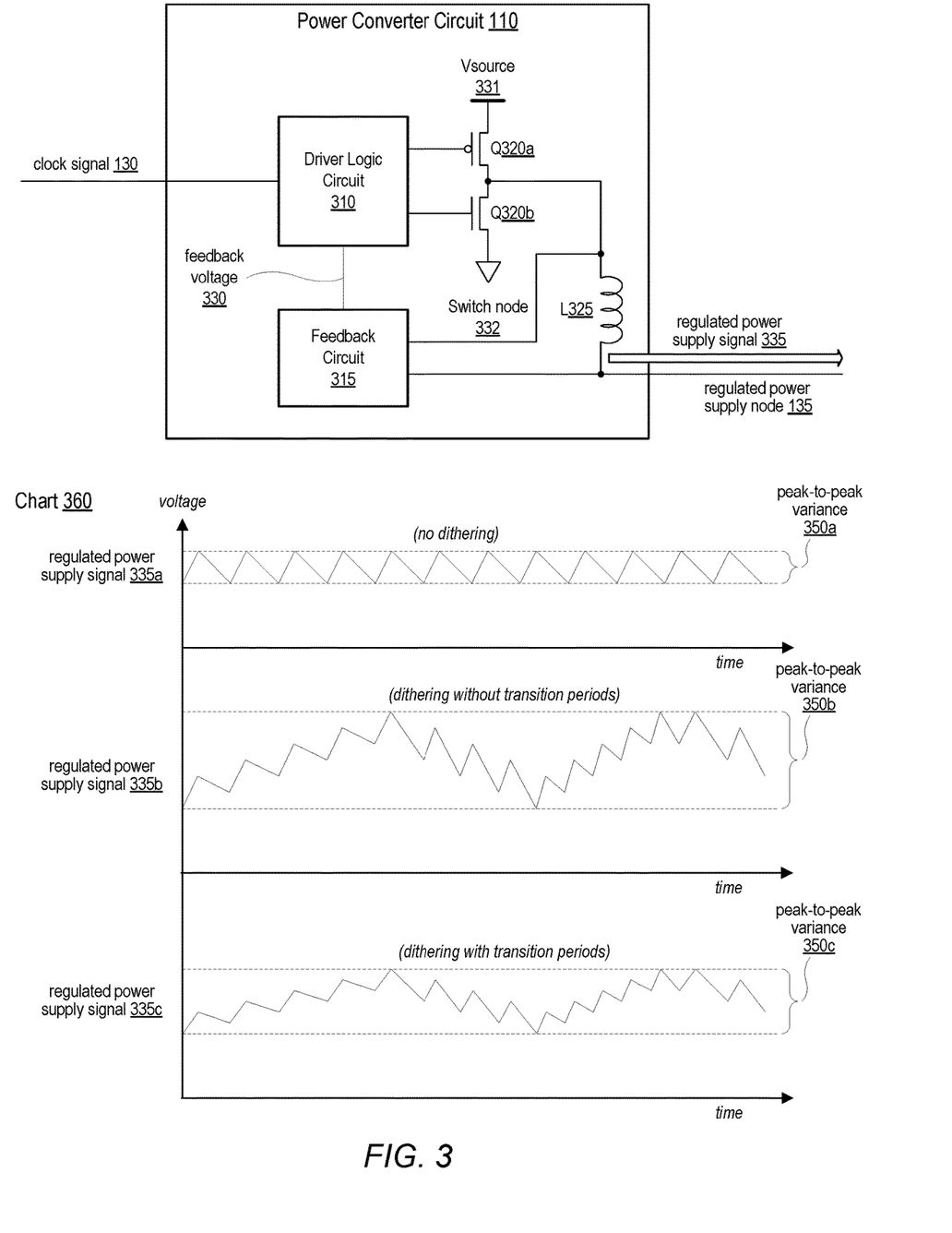
FIG. 3 depicts a block diagram of an embodiment of a power converter circuit and three charts of waveforms associated with an output of the power converter circuit.

FIG. 2 focuses on various aspects of generation of a clock signal and techniques for transitioning the clock signal between clock frequencies. As described herein, the clock generation techniques may be utilized for generation of a clock signal to be used by a power converter circuit. FIG. 3 illustrates an example of a power converter circuit and depicts how the clock signal may affect a regulated power supply signal.

Turning to FIG. 3, a block diagram of a power converter circuit is depicted along with a chart illustrating three waveforms that may be associated with power converter circuits. Power converter circuit 110 includes driver logic circuit 310, coupled to feedback circuit 315 as well as transconductive devices Q320a and Q320b. Q320a and Q320b are further coupled to inductive device L325 which, in turn, is coupled to regulated power supply node 135. Power converter circuit 110 receives clock signal 130 from clock generation circuit 105 (not shown) and generates regulated power supply signal 335 on regulated power supply node 135. Chart 360 shows three waveforms depicting a voltage level of regulated power supply signal 335 versus time in response to three different methods of generating clock signal 130.

As illustrated, power converter circuit 110 generates regulated power supply signal 335 on regulated power supply node 135 by alternately enabling Q320a and Q320b to, respectively, source current to, or sink current from switch node 332. Using clock signal 130, driver logic circuit 310 enables Q320a to source current from power supply Vsource 331 to switch node 332 for a first amount of time. After the first amount of time, driver logic circuit 310 disables Q320a and may enable Q320b to sink current from switch node 332 to a ground reference signal for a second amount of time. Sourced current flows through L325 and charges regulated power supply node 135 to generate a voltage level corresponding to regulated power supply signal 335. By switching Q320a and Q320b on and off at appropriate times, a target voltage level may be generated for regulated power supply signal 335 that is less than a voltage level of Vsource 331.

Feedback circuit 315 monitors switch node 332 and regulated power supply node 135 and generates feedback voltage 330 based on the monitoring. Driver logic circuit 310 adjust the on and off times for each of Q320a and 320b in order to maintain the voltage level of regulated power supply signal 335 within a particular range of the target voltage level. Since the on and off timing for Q320a and Q320b is based on a frequency of clock signal 130, changes in the frequency of clock signal 130 may affect the voltage level of regulated power supply signal 335.

Chart 360 illustrates possible effects the frequency of clock signal 130 may have on regulated power supply signal 335. For the three illustrated waveforms, a constant load current is assumed to be sunk from regulated power supply node 135. In chart 360, regulated power supply signal 335a depicts the voltage level over time while clock signal 130 is generated with a constant frequency. With no dithering of the frequency of clock signal 130, power converter circuit 110 may generate regulated power supply signal 335a with peak-to-peak variance 350a. As shown, peak-to-peak variance 350a is consistent over time and the voltage ripple displayed may be generally due to the on and off switching of Q320a and Q320b. While this peak-to-peak variance 350a may be desirable in comparison to the other waveforms presented, the constant frequency of the switching of Q320a and Q320b may result in EMI emissions peaking at the same frequency as the voltage ripples.

Regulated power supply signal 335b depicts the voltage level while the frequency of clock signal 130 is dithered, wherein the dithering transitions do not utilize the transition periods previously described. For this waveform, the dithering transitions are implemented as an abrupt switch from a first frequency to a second frequency. As a result of the abrupt switching, power converter circuit 110 requires time to adjust to the abrupt frequency changes through feedback voltage 330, resulting in peak-to-peak variance 350b, which is much larger than peak-to-peak variance 350a. EMI emissions, however, may be reduced due to varying the frequency of the voltage ripples in response to the dithering.

Regulated power supply signal 335c also depicts the voltage level while the frequency of clock signal 130 is dithered, except the dithering transitions include use of the transition periods disclosed herein. By eliminating the abrupt changes in frequency through use of transition periods, such as transition periods 140a-140d and 240a-240d, peak-to-peak variance 350c is reduced to a level that is less than peak-to-peak variance 350b. While peak-to-peak variance 350c is greater than peak-to-peak variance 350a, the duration of dithering intervals, transition periods, and toggle cycles can be selected to generate regulated power supply signal 335 with an acceptable amount of peak-to-peak voltage ripple as well as an acceptable amount of EMI emissions.

It is noted that the waveforms shown in FIG. 3 are merely examples. The waveforms are simplified for clarity. In other embodiments, the voltage domain waveforms may be different from those illustrated due to circuit designs used to implement power converter circuit 110, fabrication variations of circuit elements, and the like.

Figure 4:
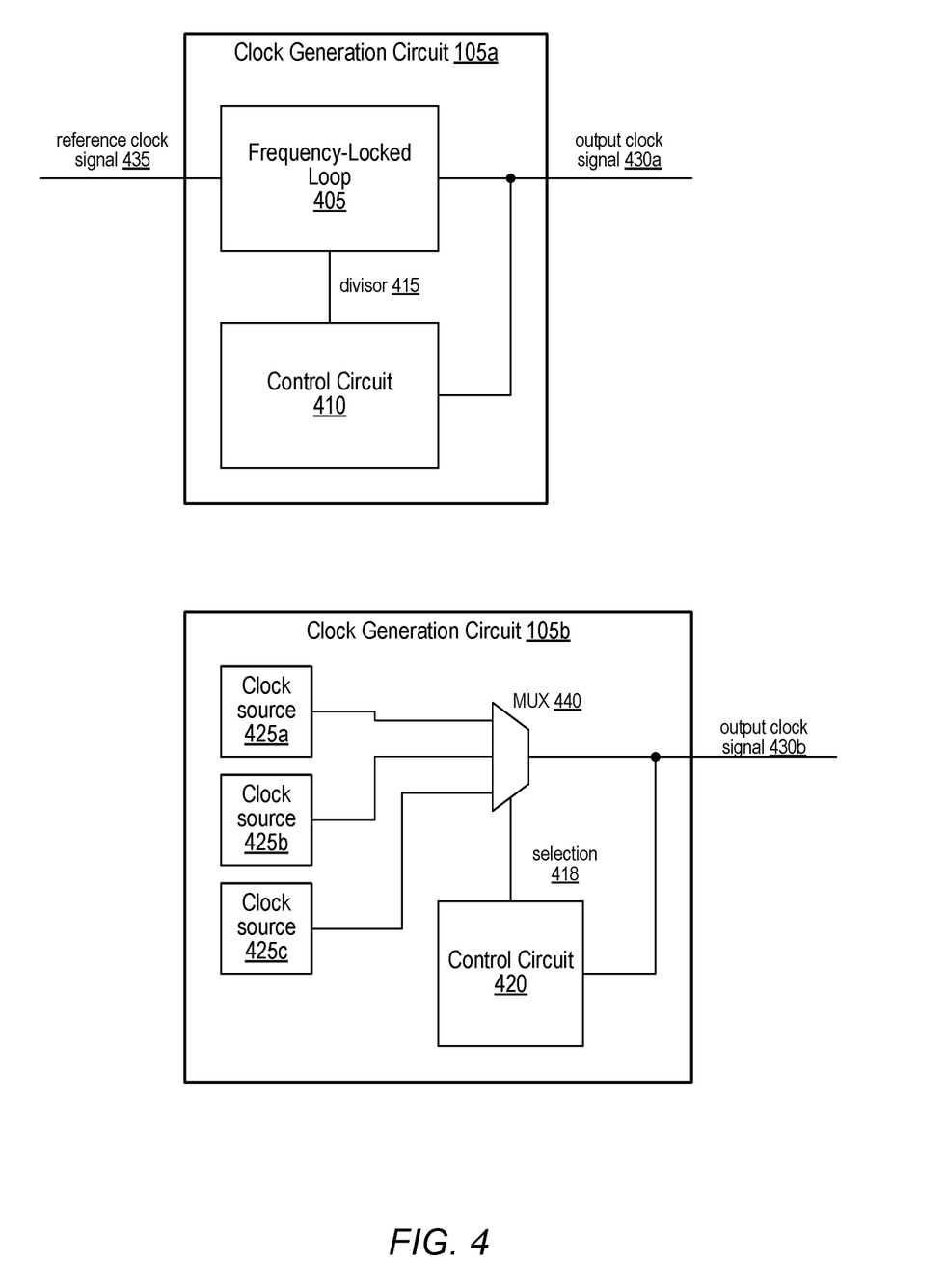
FIG. 4 illustrates block diagrams of two embodiments of clock generation circuits.

FIG. 3 provides details concerning design and operation of a power converter circuit. As shown in FIG. 1, system 100 includes both a power converter circuit and a clock generation circuit. Clock generation circuits may employ a variety of designs. In FIG. 4 below, additional details regarding two possible designs of a clock generation circuit are presented.

Proceeding to FIG. 4, block diagrams for two embodiments of a clock generation circuit are illustrated. As shown, clock generation circuit 105a includes frequency-locked loop circuit 405 and control circuit 410. Clock generation circuit 105a receives reference clock signal 435 and generates output clock signal 430a. Clock generation circuit 105b includes three clock sources 425a-425c coupled to multiplexing circuit (MUX) 440, which in turn is coupled to control circuit 420. Either of clock generation circuits 105a or 105b may be used as clock generation circuit 105 in FIG. 1, with output clock signal 430a or 430b, respectively, corresponding to clock signal 130.

Referring to clock generation circuit 105a, frequency-locked loop circuit 405 is configured to generate output clock signal 430a with a frequency that is based on reference clock signal 435 and divider value 415. As shown, frequency-locked loop circuit 405 generates output clock signal 430a as a multiple of reference clock signal 435 by dividing the frequency of output clock signal 430a by a value corresponding to divider value 415 and then comparing a number of clock pulses occurring on the divided output clock signal to a number of clock pulses occurring on reference clock signal 435 over a same time period. Based on the comparison, frequency-locked loop circuit 405 may increase or decrease the frequency of output clock signal 430a until the comparison indicates that the two numbers of clock pulses match or are within an acceptable range of each other. In various embodiments, divider value 415 may be an integer or non-integer value.

Divider value 415 is set by control circuit 410. Control circuit 410 is configured to dither the frequency of output clock signal 430a among a range of frequencies (e.g., range of dithering frequencies 120), including a transition from a first frequency in the range to a second frequency in the range. Changing the frequency of output clock signal 430a includes modifying, by control circuit 410, divider value 415. For example, control circuit 410 may include registers or other storage circuits that store respective divider values 415 for each frequency in the range. In other embodiments, control circuit 410 may receive divider value 415 from a different circuit in system 100, such as a processor core. In some embodiments, control circuit 410 is configured to determine the second frequency by adding/subtracting a predetermined frequency step to the first frequency by adding/subtracting a predetermined value to divider value 415.

As illustrated, to transition from the first frequency to the second frequency during an initial transition period of a series of transition periods (e.g., transition period 140*a* in FIG. 1), control circuit 410 is configured to alternate divider value 415 to generate the second frequency for a first percentage of the initial transition period and to generate the first frequency for a remaining percentage of the initial transition period. During an intermediate transition period of the series (e.g., transition period 140*b*), control circuit 410 alternates divider value 415 to generate the second frequency for a second percentage of the intermediate transition period and to generate the first frequency for a remaining percentage of the intermediate transition period. In the intermediate transition period, as described above, the second percentage is greater than the first percentage. During a final transition period of the series (e.g., transition period 140*d*), control circuit 410 sets divider value 415 to generate the second frequency for a duration of the final transition period.

Dithering the frequency of output clock signal 430*a* further includes a subsequent transition from the second frequency to a third frequency in the range, that is different from the first frequency. In some embodiments, to transition from the second to the third frequency, the frequency transition process is repeated, using the same percentages as described above. For example, control circuit 410 may be configured to alternate, during an initial transition period of a different series of transition periods, divider value 415 to generate the third frequency for the first percentage and to generate the second frequency for the remaining percentage of the initial transition period of the different series of transition periods. During an intermediate transition period of the different series of transition periods, control circuit 410 may be further configured to alternate divider value 415 to generate the third frequency for the second percentage and to generate the second frequency for the remaining percentage of the intermediate transition period of the different series of transition periods.

To alternate divider value 415 in some embodiments, control circuit 410 is configured to toggle divider value 415 between a first and second value for a plurality of times. The first value causes output clock signal 430*a* to have the first frequency and the second value causes output clock signal 430*a* to have the second frequency. As described previously, a particular number of cycles of output clock signal 430*a* may be generated for each toggle. For example, control circuit 410 may set divider value 415 to the second value for four cycles at the second frequency and set divider value 415 to the first value for twelve cycles at the first frequency for a first percentage of twenty-five percent in the initial transition period. In the subsequent intermediate transition periods, the number of cycles using the second value of divider value 415 is increased while the number of cycles using the first value of divider value 415 is equally decreased.

Using such a technique for operating clock generation circuit 105*a* may implement the frequency transitions as described above. Other implementations for a clock generation circuit include clock generation circuit 105*b*. Clock generation circuit 105*b* illustrates a different implementation for generating clock signal 130.

As illustrated, clock generation circuit 105*b* includes three clock sources 425*a*-425*c*. In other embodiments, additional clock sources may be included. Each of clock sources 425*a*-425*c* generates a respective clock signal with a corresponding one of the range of clock dithering frequencies described above. Control circuit 420 sends selection signal 418 to MUX 440. A value of selection signal 418 causes MUX 440 to select a corresponding output of one of clock sources 425*a*-425*c* as output clock signal 430*b*. Control circuit 420 may otherwise operate in a similar manner as described for control circuit 410 to implement transition periods 140*a*-140*d* by selecting between the outputs of clock sources 425*a*-425*c*.

It is noted that FIG. 4 merely depicts two examples of clock generation circuits. It is contemplated that other types of clock generation circuit designs may be implemented in various embodiments. For example, a phase-locked loop circuit or delay-locked loop circuit may be used in place of the frequency-locked loop circuit in clock generation circuit 105*a*. Although three clock sources are illustrated in clock generation circuit 105*b*, any suitable number may be included.

The circuits described above in FIGS. 1-4 may perform frequency transitions using a variety of methods. Two such methods for perform frequency transitions as part of a frequency dithering process are described in FIGS. 5 and 6.

Figure 5:
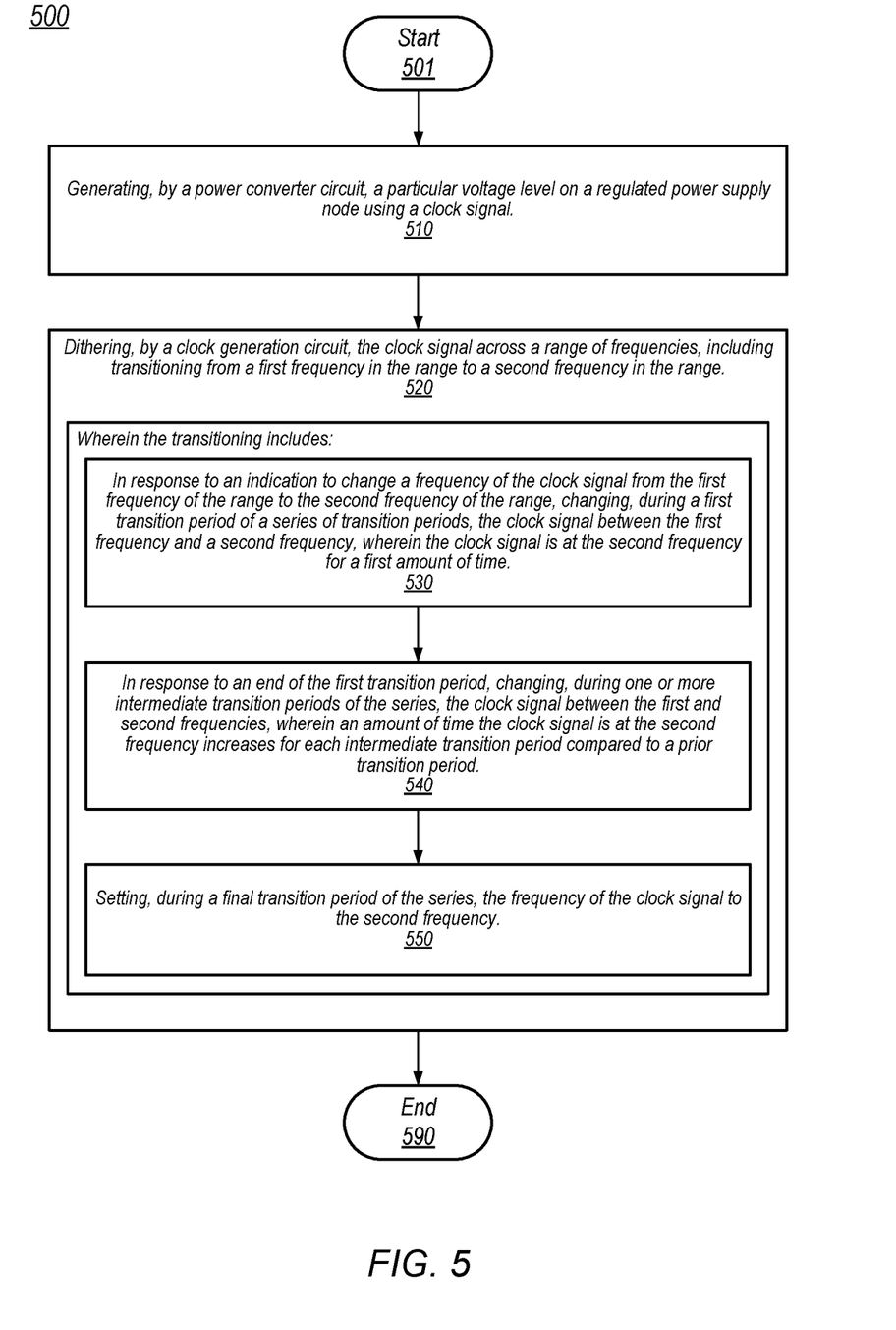
FIG. 5 shows a flow diagram of an embodiment of a method performing a first transition of a frequency of a clock signal as part of a dithering operation.

Moving now to FIG. 5, a flow diagram for an embodiment of a method for transitioning a frequency of a clock signal by a clock generation circuit is shown. Method 500 may be performed by clock generation circuit 105 in FIG. 1. In some embodiments, method 500 may be performed by a computer system (e.g., system 100) that has access to a non-transitory, computer-readable medium having program instructions stored thereon that are executable by the computer system to cause the operations described in regards to FIG. 5. Referring collectively to FIGS. 1 and 5, method 500 begins in block 501.

Method 500 includes, at block 510, generating, by power converter circuit 110, a particular voltage level on regulated power supply node 135 using clock signal 130. As illustrated above, power converter circuit 110 uses clock signal 130 to generate control signals for alternatively sourcing and sinking current to a switching node (e.g., switching node 332 in FIG. 3) that is coupled to regulated power supply node 135. The current on the switching node generates a power signal on regulated power supply node 135. Due to operating characteristics of power converter circuit 110, a frequency of clock signal 130 is dithered to reduce EMI emitted as a result of the power conversion process.

Method 500 also includes, at block 520, dithering, by clock generation circuit 105, clock signal 130 across range of dithering frequencies 120, including transitioning from a first frequency 150*a* in the range to a second frequency 150*b* in the range. As shown in FIG. 2, clock generation circuit 105 is configured to dither clock signal 130 by stepping the frequency of clock signal 130 through range of dithering frequencies 120. Each step is performed at a beginning of a dithering interval, such each of dithering intervals 260*a*-260*e*. To avoid an abrupt change in frequency at each step, clock generation circuit 105 fades from frequency 150*a* to frequency 150*b* using a particular transitioning technique. This transitioning includes several steps, as described in blocks 530-550.

At block 530, method 500 includes in response to an indication to change a frequency of clock signal 130 from frequency 150*a* of the range to frequency 150*b* of the range, changing, during transition period 140*a* of a series of transition periods 140*a*-140*d*, clock signal 130 between frequency 150*a* and frequency 150*b*. For example, clock generation circuit 105 initiates transition period 140*a* in response to an indication to begin first transition 145. Clock generation circuit 105 generates clock signal 130 at frequency 150*b* for a first amount of time. The first amount of time corresponds to a first percentage of transition period 140a (e.g., 20%, 25%, 30%, etc.). In some embodiments, the changing, during transition period 140a, includes toggling the frequency of clock signal 130 between frequencies 150a and 150b a plurality of times, wherein the frequency of clock signal 130 remains set for a plurality of clock cycles between each toggle. As previously described, clock generation circuit 105 may generate clock signal 130 at frequency 150b for a particular number of cycles and then generate clock signal 130 at frequency 150a for a different number of cycles. Clock generation circuit 105 may toggle between frequencies 150a and 150b a number of times before transition period 140a ends.

The method further includes, at block 540, in response to an end of transition period 140a, changing, during one or more intermediate transition periods of the series (e.g., transition periods 140b and 140c), clock signal 130 between frequencies 150a and 150b. As shown in FIG. 1, an amount of time clock signal 130 is at frequency 150b increases for each intermediate transition period compared to a prior transition period. For example, during transition period 140b, clock signal 130 is generated at frequency 150b for a greater percentage of the period than in transition period 140a. During transition period 140c, however, clock signal 130 is generated at frequency 150b for a greater percentage of the period than in transition period 140b.

At block 550, the method also includes setting, during a final transition period of the series, the frequency of clock signal 130 to frequency 150b. As illustrated in FIG. 1, the frequency of clock signal 130 is set to frequency 150b for the duration of transition period 140d. In some embodiments, this final transition period may be omitted and the frequency is set to frequency 150b at the end of transition period 140c. Transition period 140d may be utilized as a stabilization time during which further changes to the generation of clock signal 130 are avoided. Method 500 ends in block 590.

Figure 6:
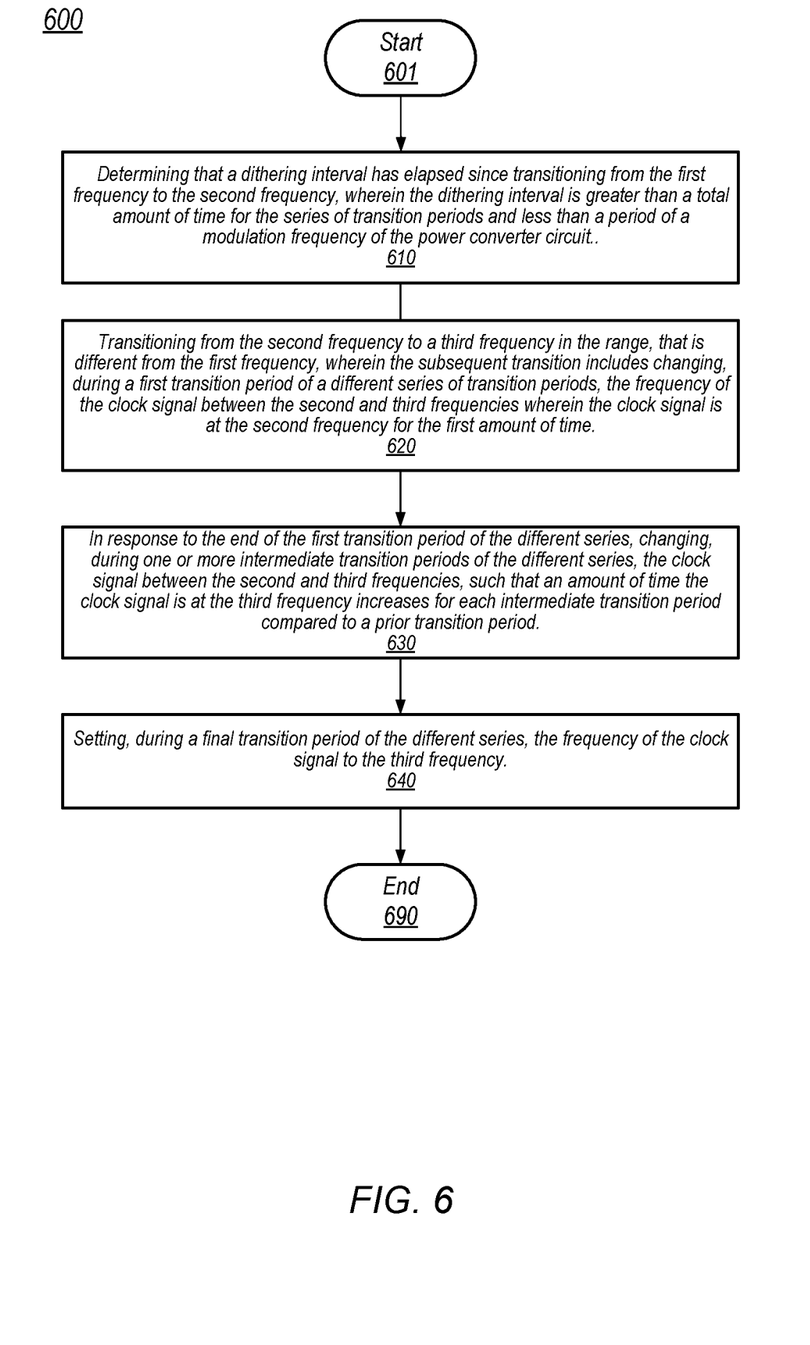
FIG. 6 depicts a flow diagram of an embodiment of a method for performing a second transition of a frequency of a clock signal as part of a dithering operation.

Turning now to FIG. 6, a flow diagram of a method for performing a second frequency transition at the end of a dithering interval is illustrated. Method 600 may be performed by a clock generation circuit such as clock generation circuit 105 in FIG. 1. In some embodiments, method 600 may be performed subsequent to method 500 in FIG. 5. Method 600, in some embodiments, may be performed by a computer system (e.g., system 100) that has access to a non-transitory, computer-readable medium having program instructions stored thereon that are executable by the computer system to cause the operations described in regards to FIG. 6. Referring collectively to FIGS. 1, 2, and 6, method 600 begins in block 601 with operations of method 600 having been completed for a transition from a first frequency 250e to a second frequency 250d (e.g., time t5 in FIG. 2).

At block 610, method 600 includes determining that dithering interval 260e has elapsed since transitioning from frequency 250e to frequency 250d. Dithering interval 260e is greater than a total amount of time for the series of transition periods 240a-240d. As shown, dithering interval 260e is approximately five times longer than a total of transition periods 240a-240d. In various embodiments, the difference in duration between one series of transition periods and one dithering interval may be any suitable amount of time. The duration of the dithering interval, however, will remain longer than the sum of one series of transition periods since the series of transition periods completes a single frequency transition, such as transition 245. A first transition at a beginning of a particular dithering interval completes before a second transition at a beginning of a next dithering interval starts.

Method 600 further includes, at block 620, transitioning from frequency 250d to frequency 250c, that is different from frequency 250e. Transition 245 includes changing, during a first transition period 240a of a different series of transition periods 240a-240d, the frequency of clock signal 130 between frequencies 250d and 250c. As described above for block 530 of method 500, the first amount of time corresponds to a first percentage of transition period 240a (e.g., 20%, 25%, 30%, etc.). Clock signal 130 may be at frequency 250c for a same percentage of time as used in block 530. In some embodiments, a percentage of cycles of clock signal 130 is used to determine a duration for generating clock signal 130 at frequency 250c.

At block 630, method 600 further includes, in response to the end of transition period 240a of the different series, changing, during one or more intermediate transition periods (e.g., 240b and 240c) of the different series, clock signal 130 between frequencies 250d and 250c. An amount of time the clock signal is at frequency 250c increases for each intermediate transition period compared to a prior transition period. As described above in regards to block 540, during transition period 240b, clock signal 130 is generated at frequency 250c for a greater percentage of the period than in transition period 240a. During transition period 240c, however, clock signal 130 is generated at frequency 250c for a greater percentage of the period than in transition period 240b.

Method 600 also includes, at block 640, setting, during a final transition period 240d of the different series, the frequency of clock signal 130 to frequency 250c. As illustrated in FIG. 2, the frequency of clock signal 130 is set to frequency 250c for the duration of transition period 240d. In a similar manner as described in regards to block 550, this final transition period may be omitted in some embodiments, and the frequency is set to frequency 250c at the end of transition period 240c. The method ends in block 690.

It is noted that methods 500 and 600 of FIGS. 5 and 6 are merely examples. Variations of the disclosed methods are contemplated. In some embodiments, additional operations may be included. For example, although not described in FIGS. 5 and 6, the frequency of the clock signal may be toggled between the first and second (or second and third) frequencies a plurality of times during each transition period.

Figure 7:
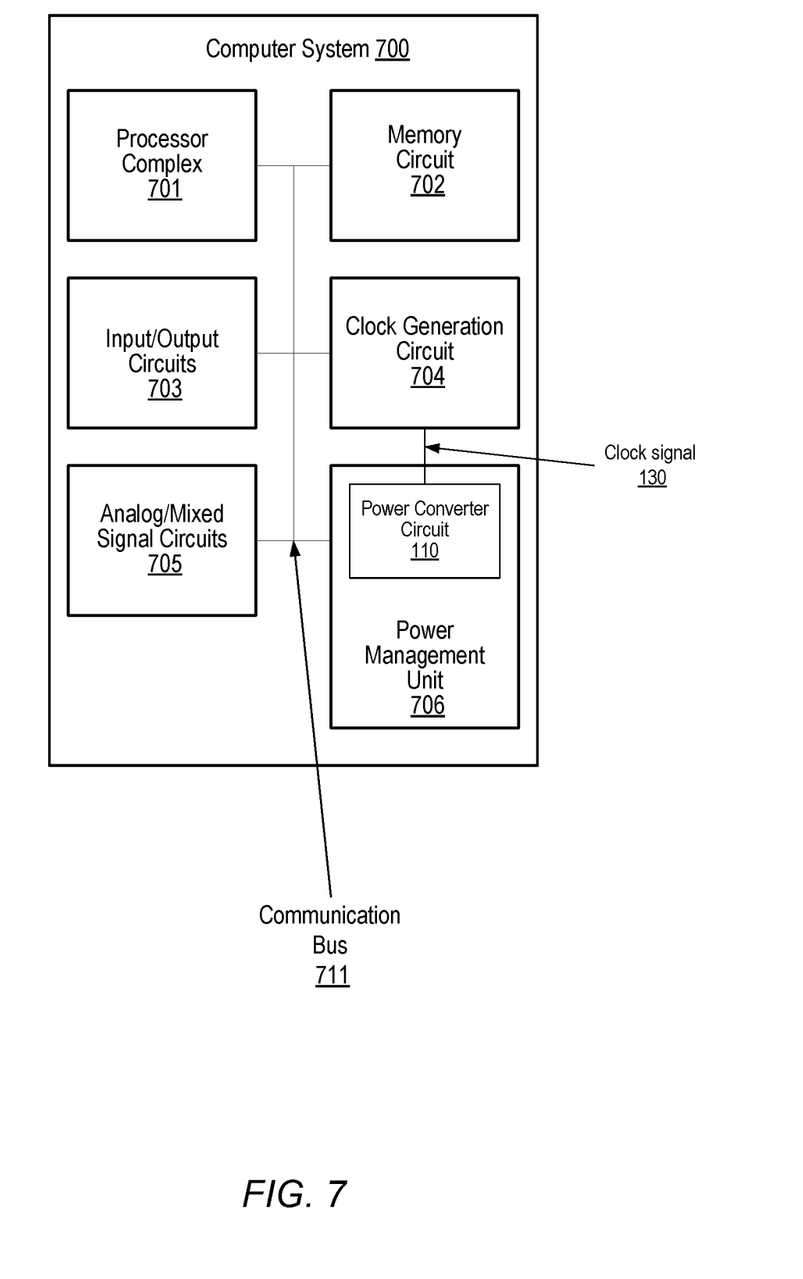
FIG. 7 depicts a block diagram of an embodiment of a computer system that includes a clock generation circuit and a power converter circuit.

FIGS. 1-6 illustrate apparatus and methods for a clock generation circuit and a power converter circuit in a system. Circuits such as those described above, may be used in a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 700 that includes the disclosed circuits is illustrated in FIG. 7. Computer system 700 may, in some embodiments, correspond to system 100 in FIG. 1. As shown, computer system 700 includes processor complex 701, memory circuit 702, input/output circuits 703, clock generation circuit 704, analog/mixed-signal circuits 705, and power management unit 706. These functional circuits are coupled to each other by communication bus 711. As shown, power management unit 706 includes an embodiment of power converter circuit 110. As shown, clock generation circuit 704 corresponds to clock generation circuit 105 in FIG. 1, and may include clock generation circuits in addition to clock generation circuit 105. In some embodiments, power management unit 706 may include a different embodiment of clock generation circuit 105 for use with power converter circuit 110.

Processor complex 701, in various embodiments, may be representative of a general-purpose processor that performs computational operations. For example, processor complex 701 may be a central processing unit (CPU) such as a microprocessor, a microcontroller, an application-specific integrated circuit (ASIC), or a field-programmable gate array (FPGA). In some embodiments, processor complex 701 may correspond to a special purpose processing core, such as a graphics processor, audio processor, or neural processor, while in other embodiments, processor complex 701 may correspond to a general-purpose processor configured and/or programmed to perform one such function. Processor complex 701, in some embodiments, may include a plurality of general and/or special purpose processor cores as well as supporting circuits for managing, e.g., power signals, clock signals, and memory requests. In addition, processor complex 701 may include one or more levels of cache memory to fulfill memory requests issued by included processor cores.

Memory circuit 702, in the illustrated embodiment, includes one or more memory circuits for storing instructions and data to be utilized within computer system 700 by processor complex 701. In various embodiments, memory circuit 702 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 700, a single memory circuit is depicted. In other embodiments, any suitable number of memory circuits may be employed. In some embodiments, memory circuit 702 may include a memory controller circuit as well communication circuits for accessing memory circuits external to computer system 700.

Input/output circuits 703 may be configured to coordinate data transfer between computer system 700 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 703 may be configured to implement a version of Universal Serial Bus (USB) protocol or IEEE 1394 (Firewire®) protocol.

Input/output circuits 703 may also be configured to coordinate data transfer between computer system 700 and one or more devices (e.g., other computing systems or integrated circuits) coupled to computer system 700 via a network. In one embodiment, input/output circuits 703 may be configured to perform the data processing necessary to implement an Ethernet (IEEE 802.3) networking standard such as Gigabit Ethernet or 10-Gigabit Ethernet, for example, although it is contemplated that any suitable networking standard may be implemented.

Clock generation circuit 704 may be configured to enable, configure and manage outputs of one or more clock sources. In various embodiments, the clock sources may be located in analog/mixed-signal circuits 705, within clock generation circuit 704, in other blocks with computer system 700, or come from a source external to computer system 700, coupled through one or more I/O pins. In some embodiments, clock generation circuit 704 may be capable of enabling and disabling (e.g., gating) a selected clock source before it is distributed throughout computer system 700. Clock generation circuit 704 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal. As previously disclosed, clock generation may include or correspond to clock generation circuit 105, and therefore, may be configured to perform the operations described herein.

Analog/mixed-signal circuits 705 may include a variety of circuits including, for example, a crystal oscillator, PLL or FLL, and a digital-to-analog converter (DAC) (all not shown) configured to generated signals used by computer system 700. In some embodiments, analog/mixed-signal circuits 705 may also include radio frequency (RF) circuits that may be configured for operation with cellular telephone networks. Analog/mixed-signal circuits 705 may include one or more circuits capable of generating a reference voltage at a particular voltage level, such as a voltage regulator or band-gap voltage reference.

Power management unit 706 may be configured to generate a regulated voltage level on a power supply signal for processor complex 701, input/output circuits 703, memory circuit 702, and other circuits in computer system 700. In various embodiments, power management unit 706 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 706 may include various circuits for managing distribution of one or more power signals to the various circuits in computer system 700, including maintaining and adjusting voltage levels of these power signals. Power management unit 706 may include circuits for monitoring power usage by computer system 700, including determining or estimating power usage by particular circuits. As illustrated, power management circuit 706 includes power converter circuit 110, which receives clock signal 130 from clock generation circuit 704. In other embodiments, in place of receiving clock signal 130 from clock generation circuit 704, power management unit 706 may include a local embodiment of clock generation circuit 105 to provide clock signal 130 independently of other clock signals clock generation circuit 704 provides to the other circuits of computer system 700.

It is noted that the embodiment illustrated in FIG. 7 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 8:
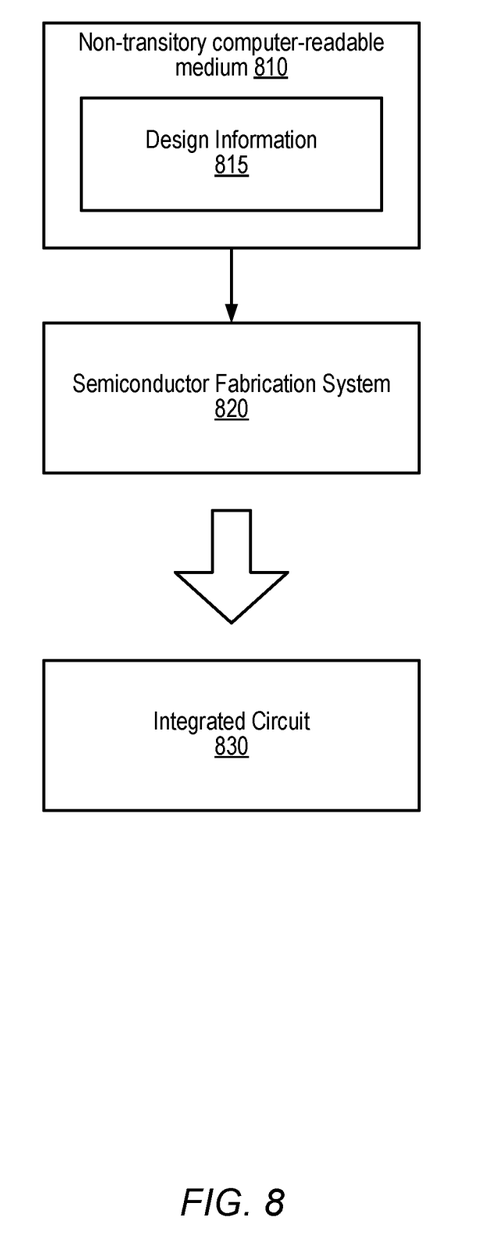
FIG. 8 illustrates a block diagram depicting an example computer-readable medium, according to some embodiments.

FIG. 8 is a block diagram illustrating an example of a non-transitory computer-readable storage medium that stores circuit design information, according to some embodiments. The embodiment of FIG. 8 may be utilized in a process to design and manufacture integrated circuits, such as, for example, an IC that includes computer system 700 of FIG. 7. In the illustrated embodiment, semiconductor fabrication system 820 is configured to process the design information 815 stored on non-transitory computer-readable storage medium 810 and fabricate integrated circuit 830 based on the design information 815.

Non-transitory computer-readable storage medium 810, may comprise any of various appropriate types of memory devices or storage devices. Non-transitory computer-readable storage medium 810 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system, such as semiconductor fabrication system 820, for example. In some embodiments, design information 815 may include a netlist that specifies elements of a cell library, as well as their connectivity. One or more cell libraries used during logic synthesis of circuits included in integrated circuit 830 may also be included in design information 815. Such cell libraries may include information indicative of device or transistor level netlists, mask design data, characterization data, and the like, of cells included in the cell library.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown or described herein. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a power converter circuit configured to generate a particular voltage level on a regulated power supply node using a clock signal; and
 a clock generation circuit configured to dither a frequency of the clock signal from a constant first frequency in the range to a different, constant second frequency in the range, wherein to transition from the first frequency to the second frequency, the clock generation circuit is configured to:
  change, during an initial transition period of a series of transition periods, the frequency of the clock signal between the first and second frequencies such that the clock signal is at the second frequency for a first percentage of the initial transition period;
  change, during one or more intermediate transition periods of the series, the frequency of the clock signal between the first and second frequencies such that the clock signal is at the second frequency for a greater percentage of time during a current transition period relative to a prior transition period; and
  set, during a final transition period of the series, the frequency of the clock signal to the second frequency, wherein the clock signal is not set to the first frequency during the final transition period.

2. The apparatus of claim 1, wherein to change, during the initial and intermediate transition periods, the frequency of the clock signal between the first and second frequencies, the clock generation circuit is configured to toggle the frequency of the clock signal between the first and second frequencies a plurality of times, wherein the frequency of the clock signal remains set for a plurality of clock cycles between each toggle.

3. The apparatus of claim 1, wherein the first frequency is greater than the second frequency.

4. The apparatus of claim 1, wherein the clock generation circuit is further configured to:
 change, during an initial transition period of a different series of transition periods, the frequency of the clock signal between the second frequency and a third frequency such that the clock signal is at the third frequency for the first percentage of the initial transition period of the different series, wherein the third frequency is different from the first frequency; and change, during one or more intermediate transition periods of the different series, the frequency of the clock signal between the second and third frequencies wherein the clock signal is at the third frequency for a greater percentage of time during each of the intermediate transition periods relative to a prior transition period.

5. The apparatus of claim 4, wherein the clock generation circuit is further configured to transition from the second frequency to the third frequency in response to a determination that a dithering interval has elapsed since transitioning from the first frequency to the second frequency, wherein the dithering interval is greater than a total amount of time for the series of transitioning periods.

6. The apparatus of claim 1, wherein the clock generation circuit is further configured to:
generate the clock signal at the second frequency during twenty-five percent of the initial transition period;
generate the clock signal at the second frequency during fifty percent of a first intermediate transition period;
generate the clock signal at the second frequency during seventy-five percent of a second intermediate transition period; and
generate the clock signal at the second frequency during one hundred percent of the final transition period.

7. The apparatus of claim 1, wherein the clock generation circuit is further configured to determine the second frequency by subtracting a predetermined frequency step from the first frequency.

8. A method, comprising:
generating, by a power converter circuit, a particular voltage level on a regulated power supply node using a clock signal; and
dithering, by a clock generation circuit, the clock signal, including transitioning from a constant first frequency in the range to a different, constant second frequency in the range, wherein the transitioning includes:
in response to an indication to change a frequency of the clock signal from the first frequency of the range to the second frequency of the range, changing, during a first transition period of a series of transition periods, the clock signal between the first frequency and the second frequency, wherein the clock signal is at the second frequency for a first percentage of the initial transition period;
in response to an end of the first transition period, changing, during one or more intermediate transition periods of the series, the clock signal between the first and second frequencies, wherein the clock signal is at the second frequency for a greater percentage of time during each intermediate transition period compared to a prior transition period; and
setting, during a final transition period of the series, the frequency of the clock signal to the second frequency, wherein the clock signal is not set to the first frequency during the final transition period.

9. The method of claim 8, wherein the changing, during the first transition period, includes toggling the frequency of the clock signal between the first and second frequencies a plurality of times, wherein the frequency of the clock signal remains set for a plurality of clock cycles between each toggle.

10. The method of claim 8, wherein the dithering further includes a subsequent transition from the second frequency to a third frequency, that is different from the first frequency, wherein the subsequent transition includes changing, during a first transition period of a different series of transition periods, the frequency of the clock signal between the second and third frequencies wherein the clock signal is at the second frequency for the first percentage of the initial transition period.

11. The method of claim 10, wherein the subsequent transition further includes, in response to the end of the first transition period of the different series, changing, during one or more intermediate transition periods of the different series, the clock signal between the second and third frequencies, such that the clock signal is at the third frequency for a greater percentage of time during each of the intermediate transition periods compared to a prior transition period.

12. The method of claim 10, further comprising transitioning, from the second frequency to the third frequency, in response to a determination that a dithering interval has elapsed since transitioning from the first frequency to the second frequency, wherein the dithering interval is greater than a total amount of time for the series of transition periods.

13. The method of claim 8, further comprising generating, by the clock generation circuit, the clock signal using a reference signal and a divider value; and
wherein changing the frequency of the clock signal includes modifying, by the clock generation circuit, the divider value.

14. The method of claim 8, wherein the first frequency is less than the second frequency.

15. An apparatus, comprising:
a frequency-locked loop circuit configured to generate an output clock signal with a frequency that is based on a reference clock signal and a divider value; and
a control circuit configured to:
dither the frequency of the output clock signal, including a transition from a constant first frequency to a different, constant second frequency, wherein to transition from the first frequency to the second frequency, the control circuit is configured to:
during an initial transition period of a series of transition periods, alternate the divider value to generate the second frequency for a first percentage of the initial transition period and to generate the first frequency for a remaining percentage of the initial transition period;
during an intermediate transition period of the series, alternate the divider value to generate the second frequency for a second percentage of the intermediate transition period and to generate the first frequency for a remaining percentage of the intermediate transition period, wherein the second percentage is greater than the first percentage; and
set, during a final transition period of the series, the divider value to generate the second frequency for a duration of the final transition period.

16. The apparatus of claim 15, wherein to alternate the divider value, the control circuit is configured to toggle the divider value between a first and second value for a plurality of times, wherein the first value causes the output clock signal to have the first frequency and the second value causes the output clock signal to have the second frequency.

17. The apparatus of claim 15, wherein to dither the frequency of the output clock signal, the control circuit is configured to include a subsequent transition from the second frequency to a third frequency in the range, that is different from the first frequency, and wherein to transition from the second to the third frequency, the control circuit is configured to alternate, during an initial transition period of a different series of transition periods, the divider value to generate the third frequency for the first percentage and to generate the second frequency for the remaining percentage of the initial transition period of the different series of transition periods.

18. The apparatus of claim 17, wherein to transition from the second frequency to the third frequency, the control circuit is further configured to alternate, during an intermediate transition period of the different series of transition periods, the divider value to generate the third frequency for the second percentage and to generate the second frequency for the remaining percentage of the intermediate transition period of the different series of transition periods.

19. The apparatus of claim 15, wherein the control circuit is further configured to determine the second frequency by adding a predetermined frequency step to the first frequency.

20. The apparatus of claim 15, wherein the control circuit is further configured to determine a duration for each of the series of transition periods using a particular number of cycles of the output clock signal.

\* \* \* \* \*